(12) United States Patent
Hsien et al.

(10) Patent No.: US 7,750,830 B2  
(45) Date of Patent: Jul. 6, 2010

(54) CALIBRATION DEVICE AND METHOD THEREOF FOR PIPELINED ANALOG-TO-DIGITAL CONVERTER

(75) Inventors: Szu-Kang Hsien, Taoyuan County (TW); Ta-Chun Pu, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 37 days.

(21) Appl. No.: 12/256,454

(22) Filed: Oct. 22, 2008

(65) Prior Publication Data

US 2010/0097252 A1    Apr. 22, 2010

(51) Int. Cl.  
*H03M 1/10* (2006.01)

(52) U.S. Cl. ............... 341/120; 341/155; 341/117; 341/118; 341/119; 341/156

(58) Field of Classification Search ......... 341/117–120, 341/158, 159, 160, 155, 156  
See application file for complete search history.

(56) References Cited

U.S. PATENT DOCUMENTS 7,075,465 B2 * 7/2006 Jonsson et al. ............. 341/120  
7,161,523 B1 * 1/2007 Zortea ........................ 341/158  
2007/0035432 A1 2/2007 Gulati et al.

OTHER PUBLICATIONS

Article titled "A Gradient-Based Algorithm for Sampling Clock Skew Calibration of SHA-less Pipeline ADCs", authored by Huang, et al., adopted from Proc. IEEE ISCAS, pp. 1241-1244, May 2007.

* cited by examiner

*Primary Examiner*—Jean B Jeanglaude  
(74) *Attorney, Agent, or Firm*—Jianq Chyun IP Office

(57) ABSTRACT

A calibration device includes a comparison unit, a counting unit, a memory, and a compensation circuit. A residue of a sub analog-to-digital converter is compared with a first and a second voltage by the comparison unit for generating a comparison result. A number of times of the residue voltage, out of bounds defined by the first and the second voltage, is counted by the counting unit in an $i^{th}$ period according to the comparison result. The number of times of the residue voltage out of the bounds in an $(i-1)^{th}$ period is stored in the memory. A clock of the sub ADC is adjusted by the compensation circuit into a direction based on the number of times of the residue voltage out of the bounds in the $i^{th}$ period and the number of times of the residue voltage out of the bounds in the $(i-1)^{th}$ period.

21 Claims, 7 Drawing Sheets

CALIBRATION DEVICE AND METHOD THEREOF FOR PIPELINED ANALOG-TO-DIGITAL CONVERTER

BACKGROUND OF THE INVENTION

1. Field of the Invention

The present invention relates to a pipelined analog-to-digital converter, and especially focuses on calibration for the pipelined analog-to-digital converter.

2. Description of Related Art

High-speed analog-to-digital converters (ADCs) are widely used in wire and wireless data communications, disk drive, instrumentation and imaging. There are quite a few architectures which could be used to implement high-speed ADCs. Pipelined architectures for ADCs are known to use less power than the other architectures for ADCs, but at the expense of conversion latency. In pipelined ADCs, power consumption can be optimized by an appreciate selection of bits per stage capacitor scaling down the pipelined ADCs. Also, pipelined ADCs are successfully implemented in CMOS technology using switched capacitor technique, which makes them easy to integrate.

FIG. 1 shows a block diagram of a conventional pipelined ADC. The pipelined ADC 100 includes k low-resolution stages (or to be known as sub ADC) 110, delay elements 120 synchronizing the stage outputs, and digital corrections 130. Each stage 110 has a resolution of Bi+ri bits, of which Bi represents the effective stage resolution and ri represents the redundancy for a comparator offset correction algorithm. Each stage 110 digitizes the residue of the previous stage 110, so accordingly, the digital output B1 of the first stage 110 contains the most significant bits while the output Bk of the last stage 110 contains the least significant bits. The stages 110 operate concurrently; that is, at any time, the first stage 110 operates on the most recent sample while all other stages 110 operate on residues from previous samples.

In order to provide a stable DC input for high-speed sampling rate, traditionally, most converters, including pipelined ADCs, make use of a dedicated front-end sample and hold amplifier (SHA) circuit. Unfortunately, the dedicated front-end SHA circuit consumes half of the total power consumption as well as occupies a large amount of die area. However, if the dedicated front-end SHA circuit is removed, the input voltage sampled by different stage 110 will be differently, this difference is called aperture error. Various ways have been proposed to remove or reduce aperture error.

SUMMARY OF THE INVENTION

A calibration device and a method thereof are provided in the present invention. The calibration device and the method thereof adapt to a sub analog-to-digital converter (ADC) of a pipelined ADC.

A calibration device is provided in the present exemplary invention, and the calibration device adapts to a sub ADC of a pipelined ADC. The calibration device comprises a comparison unit, a counting unit, a memory, and a compensation circuit. A residue voltage of the sub ADC is compared with a first voltage and a second voltage for generating a comparison result. A number of times of the residue voltage out of bounds defined by the first voltage and the second voltage in an $i^{th}$ period, according to the comparison result, that is counted by the counting unit. A clock of the sub ADC is adjusted by the compensation circuit into a direction based on the number of times of the residue voltage out of the bounds in the $i^{th}$ period and the number of times of the residue voltage out of the bounds in the $(i-1)^{th}$ period.

A calibration method is provided in the present exemplary invention, and the calibration method adapts to a sub ADC of a pipelined ADC. First, a residue voltage of the sub ADC is compared with a first voltage and a second voltage for generation a comparison signal. A number of times of the residue voltage out of bounds defined by the first voltage and the second voltage in an $i^{th}$ period is counted according to the comparison result. A clock of the sub ADC is adjusted into a direction based on the number of times of the residue voltage out of the bounds in the $i^{th}$ period and the number of times of the residue voltage out of the bounds in an $(i-1)^{th}$ period.

In order to make the features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
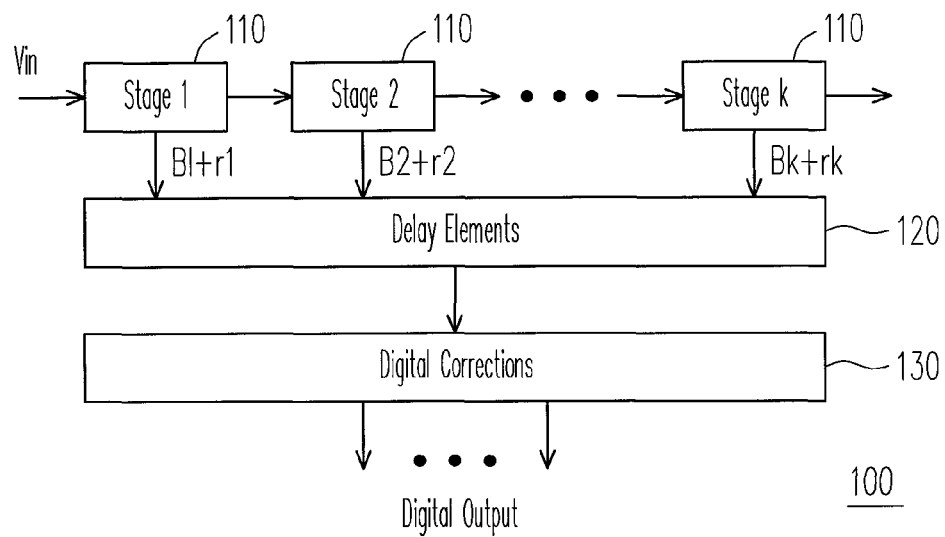
FIG. 1 shows a block diagram of a conventional pipelined analog-to-digital converter.

Reference will now be made in detail to the present embodiments of the invention, examples of which are illustrated in the accompanying drawings. Wherever possible, the same reference numbers are used in the drawings and the description to refer to the same or like parts.

Figure 2A:
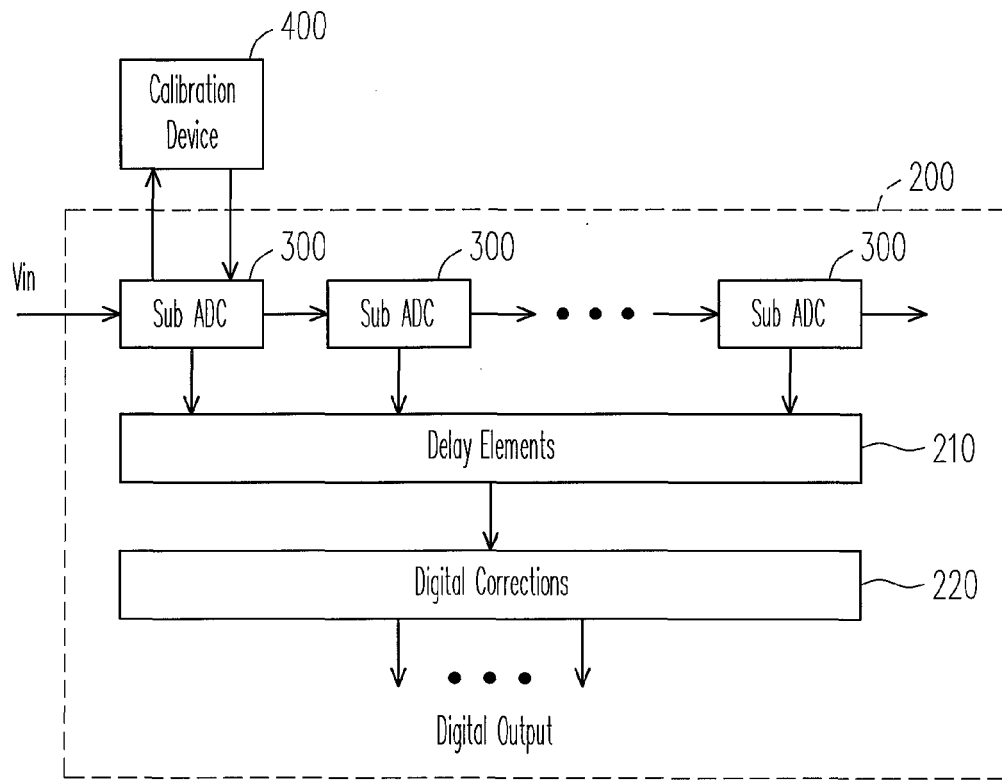
FIG. 2A shows a diagram of a calibration device for a pipelined analog-to-digital converter according to an embodiment of the invention.
Figure 2B:
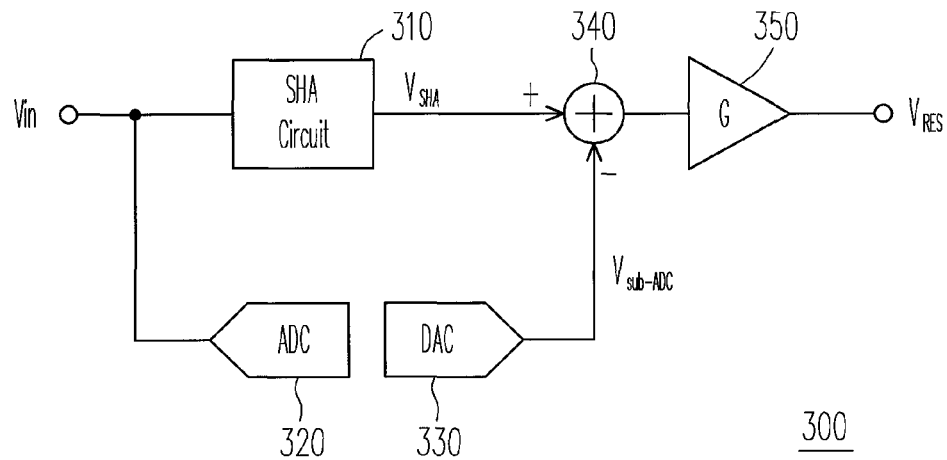
FIG. 2B shows a diagram of a sub ADC of the pipelined analog-to-digital converter in FIG. 2A according to an embodiment of the invention.

FIG. 2A shows a diagram of a calibration device for a pipelined analog-to-digital converter (ADC) according to an embodiment of the invention. The pipelined ADC 200 includes a plurality of sub ADCs 300, a delay element 210, and digital corrections 220. Each of sub ADC 300 converts a part of an input voltage Vin to a part of a digital output. The calibration device 400 is coupled to a first one of the sub ADCs for adjusting a clock of the sub ADCs. However, which one of the sub ADCs that the calibration device 400 is coupled to can not limit the invention. FIG. 2B shows a diagram of the sub ADC 300 according to an embodiment of the invention.

The sub ADC 300 includes a sample and hold amplifier (SHA) circuit 310, an analog-to-digital converter (ADC) 320, a digital-to-analog converter (DAC) 330, a summer 340, and an amplifier 350. $V_{RES}$ is the residue voltage of the sub ADC 300. The residue voltage $V_{RES}$ is formed by an aperture error of the sub ADC 300. The formulation of the aperture error of the sub ADC 300 is as follows:

$$V_{aperture\_error} = V_{SHA} - V_{sub-ADC} \quad (1)$$
$$= A(\sin\omega t_{SHA} - \sin\omega t_{sub-ADC})$$
$$\cong A\omega(t_{SHA} - t_{sub-ADC})$$
$$\cong A\omega\Delta t$$

The $\omega$ is an input frequency of the sub ADC 300. The $V_{SHA}$ is an output voltage of the SHA circuit 310 of the sub ADC 300. The $V_{sub-ADC}$ is an output voltage of the DAC 330 of the sub ADC 300. The $t_{SHA}$ represents a sampling instance of a path through the SHA circuit 310, and the $t_{sub-ADC}$ represents a sampling instance of a path through the ADC 320 and the DAC 330. The $\Delta t$ represents a difference between the $t_{SHA}$ and the $t_{sub-ADC}$. The aperture error increases as the input frequency $\omega$ of the sub ADC 300 increases. And the formulation of the residue voltage $V_{RES}$ of the sub ADC 300 is as follows:

$$V_{RES} = G \cdot (V_{SHA} - (V_{sub-ADC} + \varepsilon_q)) \quad (2)$$
$$= G \cdot (V_{SHA} - V_{sub-ADC}) - G\varepsilon_q$$
$$= G \cdot V_{aperture\_error} + V_{RES\_ideal}$$

The $\varepsilon_q$ is the noise of the sub ADC 300, the G is a gain of the amplifier 350, and the $V_{RES\_ideal}$ is an ideal residue voltage $V_{RES}$ of the sub ADC 300. The residue voltage $V_{RES}$ of the sub ADC 300 should not exceed $$\pm\frac{1}{2}V_{ref}$$

when the sampling instance of the two paths are the same, wherein the $V_{ref}$ is a reference voltage according to the ideal residue voltage $V_{RES\_ideal}$ of the sub ADC 300. But the residue voltage $V_{RES}$ of the sub ADC 300 may exceed $$\pm\frac{1}{2}V_{ref}$$

when the path offsets and the noise of the sub ADC 300 are taken into account. Thus the upper and lower bounds of the residue voltage $V_{RES}$ are set between $$\frac{1}{2}V_{ref}$$

to $V_{ref}$ and $$-\frac{1}{2}V_{ref} \text{ to } -V_{ref}.$$

Figure 3:
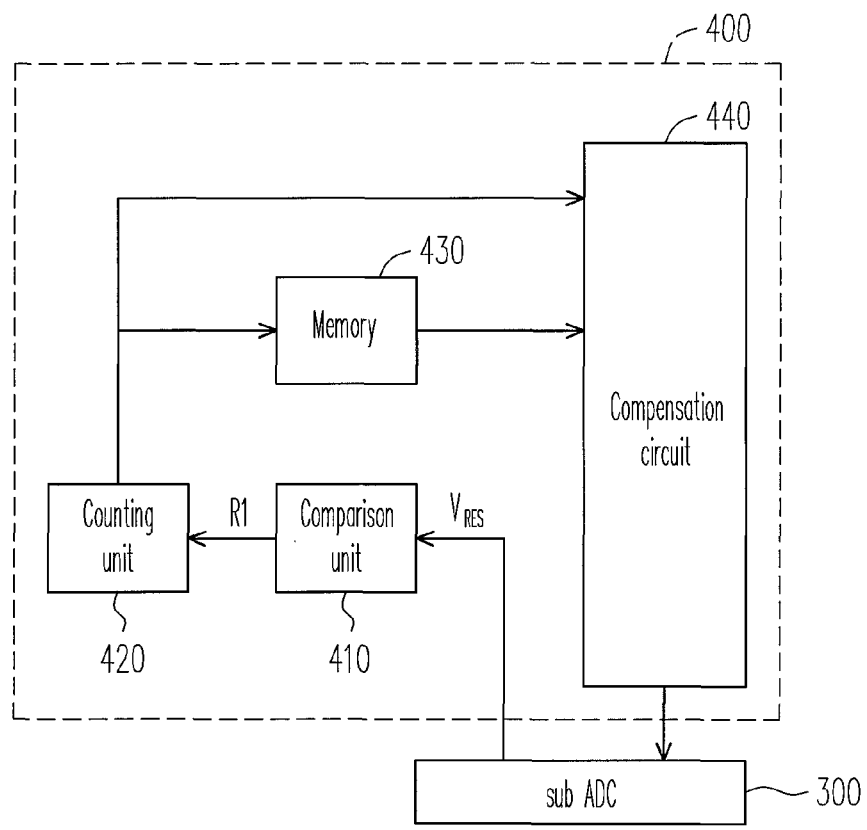
FIG. 3 shows a diagram of a calibration device according to an embodiment of the invention.

FIG. 3 shows a diagram of the calibration device 400 according to an embodiment of the invention. The calibration device 400 adapts to the sub ADCs 300 of the pipelined ADC 200 (not shown in FIG. 3). The calibration device 400 includes a comparison unit 410, a counting unit 420, a memory 430, and a compensation circuit 440. The residue voltage $V_{RES}$ of the first one of the sub ADCs 300 is sampled by the comparison unit 410, and then the comparison unit 410 compares the residue voltage $V_{RES}$ of the first one of the sub ADC 300 with a first voltage V1 and a second voltage V2 for generating a comparison result R1. The first voltage V1 is the upper bound of the residue voltage $V_{RES}$ with positive polarity, and the second voltage is the lower bound of the residue voltage $V_{RES}$ with negative polarity. Thus, the first voltage V1 and the second voltage V2 may have the same amplitude but different polarities.

The counting unit 420 counts a number N1 of times of the residue voltage $V_{RES}$ out of bounds defined by the first voltage V1 and the second voltage V2 in an $i^{th}$ period according to the comparison result R1, i.e. if the comparison result R1 indicate the residue voltage $V_{RES}$ of the first one of the sub ADC 300 is out of the bounds, the counting unit 420 increases the number N1 of times of the residue voltage $V_{RES}$ out of the bounds by one. Namely, when the residue voltage $V_{RES}$ of the first one of the sub ADC 300 is higher than the first voltage V1, the counting unit 420 increases the number N1 of times of the residue voltage $V_{RES}$ out of the bounds by one according to the comparison result R1. When the residue voltage $V_{RES}$ of the first one of the sub ADC 300 is lower than the second voltage V2, the counting unit 420 increases the number N1 of times of the residue voltage $V_{RES}$ out of the bounds by one according to the comparison result R1. The memory 430 stores the number N1 of times of the residue voltage $V_{RES}$ out of the bounds in an $(i-1)^{th}$ period.

The compensation circuit 440 adjusts the clock of the sub ADCs 300 based on the number N1 of times of the residue voltage $V_{RES}$ out of the bounds in the $i^{th}$ period and the number N1 of times of the residue voltage $V_{RES}$ out of the bounds in the $(i-1)^{th}$ period. Adjusting the clock of the sub ADCs 300 means shifting the clock of the sub ADCs 300 forward or backward. Accordingly, when the number N1 of times of the residue voltage $V_{RES}$ out of the bounds in the $i^{th}$ period is more than the number N1 of times of the residue voltage $V_{RES}$ out of the bounds in the $(i-1)^{th}$ period, the clock of the sub ADCs 300 is shifted into an opposite direction with twice of unit step by the compensation circuit 440. When the number N1 of times of the residue voltage $V_{RES}$ out of the bounds in the $i^{th}$ period is less than the number N1 of times of the residue voltage $V_{RES}$ out of the bounds in the $(i-1)^{th}$ period, the clock of the sub ADCs 300 is shifted into an original direction with unit step by the compensation circuit 440. When the number N1 of times of the residue voltage $V_{RES}$ out of the bounds in the $i^{th}$ period is equal to the number N1 of times of the residue voltage $V_{RES}$ out of the bounds in the $(i-1)^{th}$ period, the clock of the sub ADCs 300 is shifted into an alternative direction with unit step by the compensation circuit 440.

Nevertheless, the adjustment method of the steps can not limit the invention. For example, when the number N1 of times of the residue voltage $V_{RES}$ out of the bounds in the $i^{th}$ period is more than the number N1 of times of the residue voltage $V_{RES}$ out of the bounds in the $(i-1)^{th}$ period, the clock of the sub ADCs 300 may be shifted into the opposite direction but with unit step by the compensation circuit 440. When the number N1 of times of the residue voltage $V_{RES}$ out of the bounds in the $i^{th}$ period is less than the number N1 of times of the residue voltage $V_{RES}$ out of the bounds in the $(i-1)^{th}$ period, the clock of the sub ADCs 300 may be shifted into the original directional but with twice of unit step. When the number N1 of times of the residue voltage $V_{RES}$ out of the bounds in the $i^{th}$ period is equal to the number N1 of times of the residue voltage $V_{RES}$ out of the bounds in the $(i-1)^{th}$ period, the clock of the sub ADCs 300 may be kept by the compensation circuit 440.

Further, when a number N2 of times compared by the comparison unit 410 in the $i^{th}$ period is equals to a period number N3, the number N1 of times of the residue voltage $V_{RES}$ out of the bounds is stored in the memory 430, and then the number N1 of times of the residue voltage $V_{RES}$ out of the bounds and the number N2 of times compared by the comparison unit 410 are zeroed by the counting unit 420. The period number N3 is a maximum number the counting unit 420 can count in the $i^{th}$ period. In addition, the $i^{th}$ period of the calibration device 400 is related to a clock of the SHA circuit 310 of the sub ADC 300.

Figure 4A:
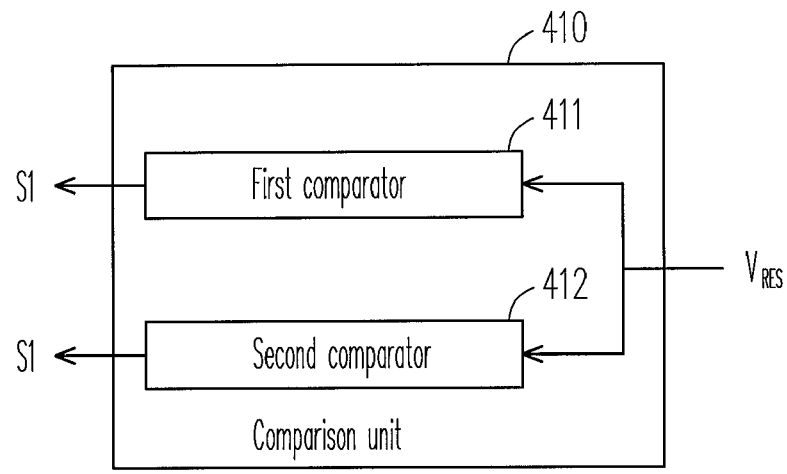
FIG. 4A shows a block diagram of a compensation unit of the calibration device in FIG. 3 according to an embodiment of the invention.

FIG. 4A shows a block diagram of the comparison unit 410 according to an embodiment of the invention. The comparison unit 410 includes a first comparator 411 and a second comparator 412. The first comparator 411 compares the residue voltage $V_{RES}$ of the first one of the sub ADCs 300 with the first voltage V1 for generating a first signal S1, and the second comparator 412 compares the residue voltage $V_{RES}$ of the first one of the sub ADCs 300 with the second voltage V2 for generating a second signal S2. Wherein the first signal S1 and the second signal S2 are included in the comparison result R1.

Figure 4B:
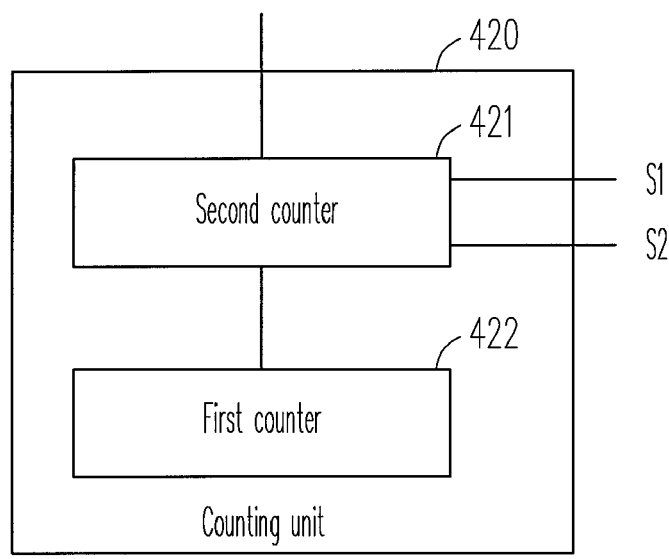
FIG. 4B shows a block diagram of a counting unit of the calibration device in FIG. 3 according to an embodiment of the invention.

FIG. 4B shows a block diagram of the counting unit 420 according to an embodiment of the invention. The counting unit 420 includes a first counter 421 and a second counter 422. The first counter 421 counts the number N2 of times compared by the comparison unit 410 in the $i^{th}$ period, and the second counter 422 counts the number N1 of times of the residue voltage $V_{RES}$ out of the bounds in the $i^{th}$ period.

Figure 4C:
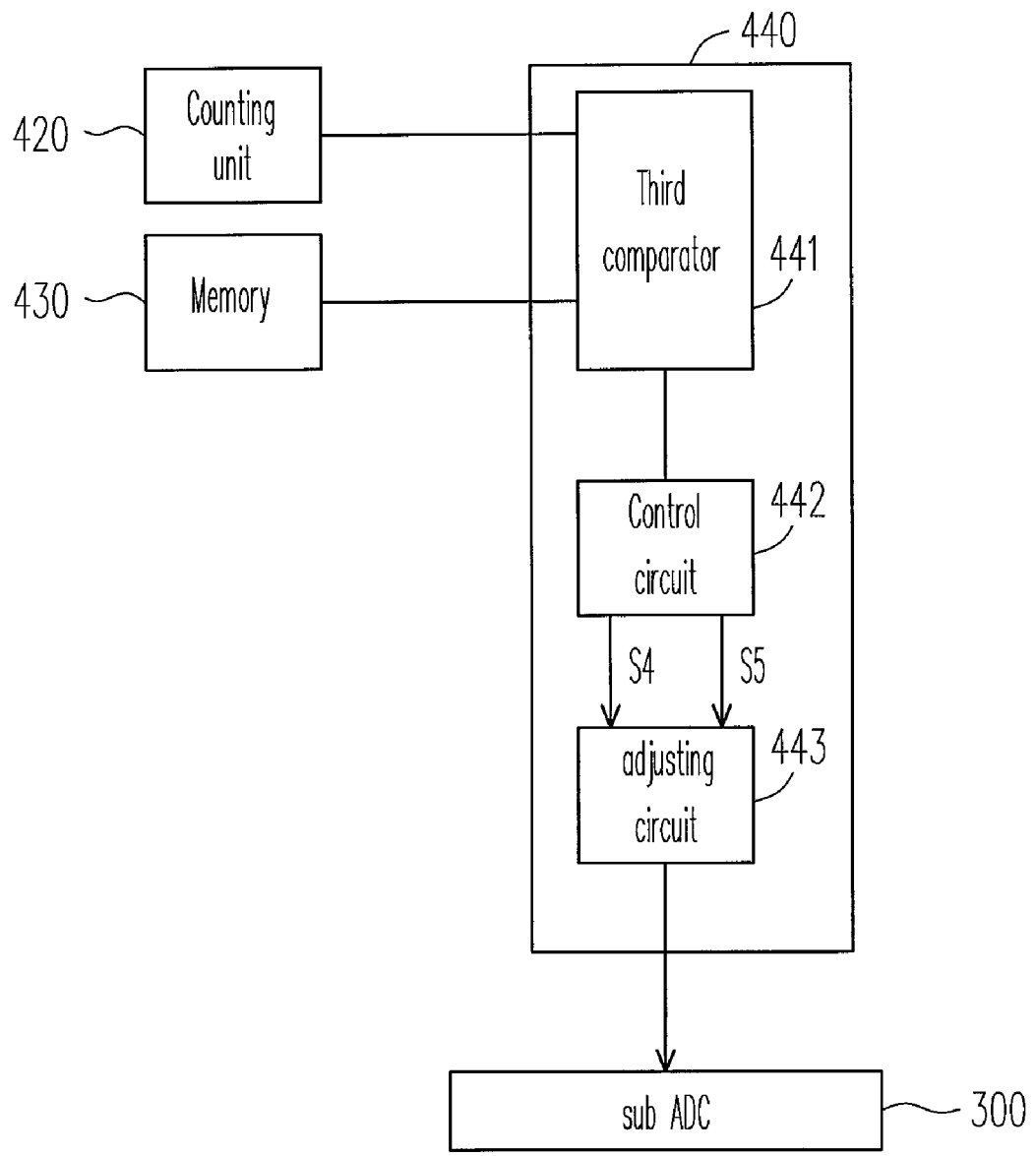
FIG. 4C shows a block diagram of a compensation circuit of the calibration device in FIG. 3 according to an embodiment of the invention.

FIG. 4C shows a block diagram of the compensation circuit 440 according to an embodiment of the invention. The compensation circuit 440 includes a third comparator 441, a control circuit 442, and an adjusting circuit 443. The third comparator 441 compares the number N1 of times of the residue voltage $V_{RES}$ out of the bounds in the $i^{th}$ period from the counting unit 420 and the number N1 of times of the residue voltage $V_{RES}$ out of the bounds in the $(i-1)^{th}$ period from the memory 430 for generating a comparison signal S3. The comparison signal S2 represents a comparison outcome of the third comparator 441. A sign signal S4 and a step signal S5 are generated by the control circuit 442 according to the comparison signal S3. The sign signal S4 represents a shifting direction of the clock of the sub ADCs 300, and the step signal S5 represents how many steps is the clock of the sub ADCs 300 shifted with along the shifting direction deciding by the sign signal S4. The clock of sub ADCs 300 is adjusted by the adjusting circuit 443 according to the sign signal S4 and the step signal S5.

The comparison signal S3 further includes a first comparison signal S31, a second comparison signal S32, and a third comparison signal S33. The first comparison signal S31 represents the number N1 of times of the residue voltage $V_{RES}$ out of the bounds in the $i^{th}$ period is more than the number N1 of times of the residue voltage $V_{RES}$ out of the bounds in the $(i-1)^{th}$ period. The second comparison signal S32 represents the number N1 of times of the residue voltage $V_{RES}$ out of the bounds in the $i^{th}$ period is less than the number N1 of times of the residue voltage $V_{RES}$ out of the bounds in the $(i-1)^{th}$ period. The third comparison signal S33 represents the number N1 of times of the residue voltage $V_{RES}$ out of the bounds in the $i^{th}$ period is equal to the number N1 of times of the residue voltage $V_{RES}$ out of the bounds in the $(i-1)^{th}$ period.

Figure 4D:
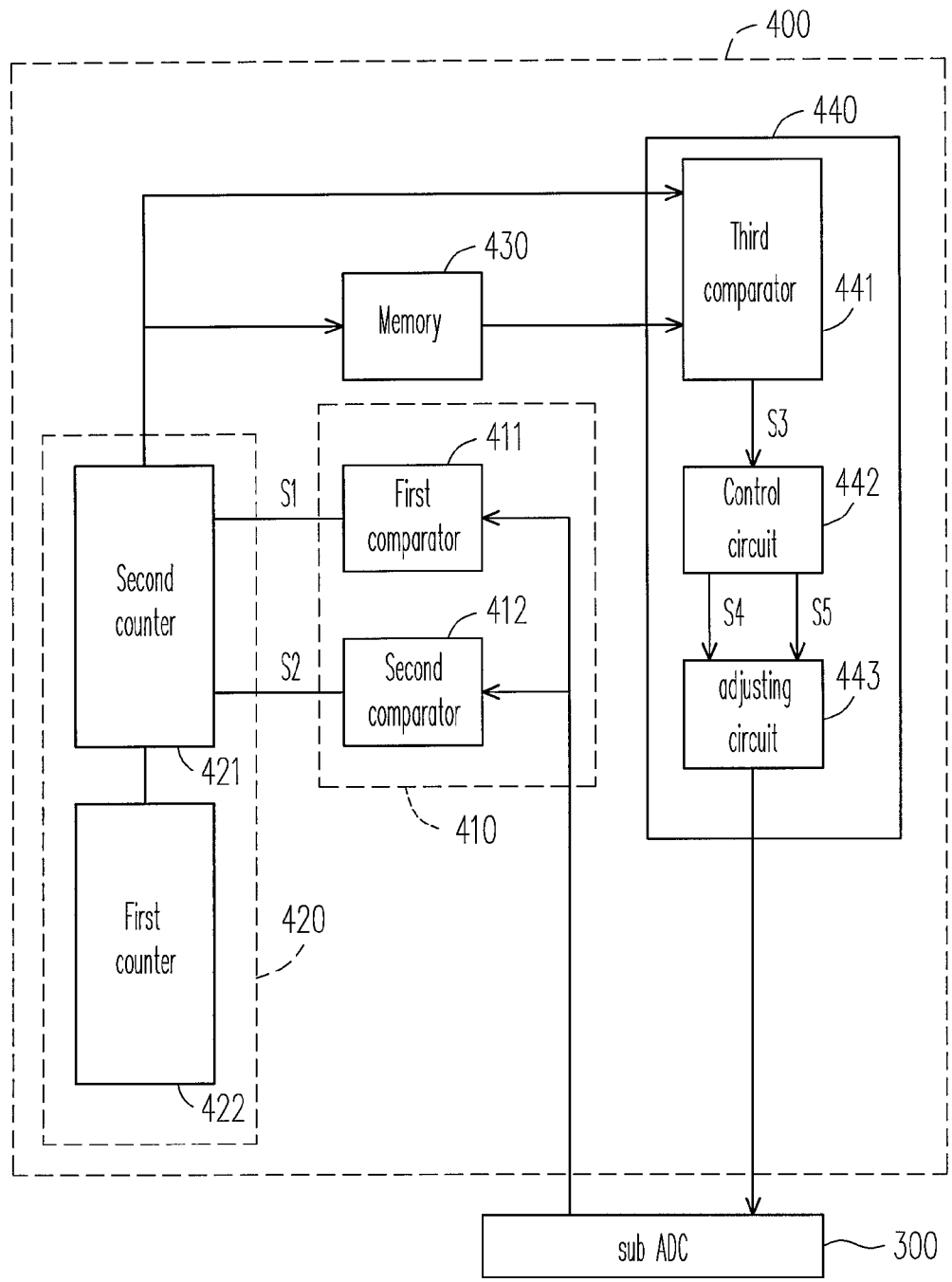
FIG. 4D shows a block diagram of the calibration device in FIG. 3 with FIG. 4A, FIG. 4B, and FIG. 4C according to an embodiment of the invention.

FIG. 4D shows a block diagram of the calibration device 400 with FIG. 4A, FIG. 4B, and FIG. 4C according to an embodiment of the invention. Referring to FIG. 4D, when the number N1 of times of the residue voltage $V_{RES}$ out of the bounds in the $i^{th}$ period is more than the number N1 of times of the residue voltage $V_{RES}$ out of the bounds in the $(i-1)^{th}$ period, the sign signal S4 changes a polarity of itself and the step signal S5 is set to two steps according to the first comparison signal S31 of the comparison signal S3, and then the adjusting circuit 443 adjusts the clock of the sub ADCs 300 to an opposite direction with twice of unit step. When the number N1 of times of the residue voltage $V_{RES}$ out of the bounds in the $i^{th}$ period is less than the number N1 of times of the residue voltage $V_{RES}$ out of the bounds in the $(i-1)^{th}$ period, the sign signal S4 keeps the polarity of itself and the step signal S5 is set to one step according to the second comparison signal S32 of the comparison signal S3, and then the adjusting circuit 443 adjusts the clock of the sub ADCs 300 to an original direction with unit step. When the number N1 of times of the residue voltage $V_{RES}$ out of the bounds in the $i^{th}$ period is equal to the number N1 of times of the residue voltage $V_{RES}$ out of the bounds in the $(i-1)^{th}$ period, the sign signal S4 alternates the polarity of itself and the step signal S5 is set to one step according to the third comparison signal S33 of the comparison signal S3, and then the adjusting circuit 443 adjusts the clock of the sub ADCs 300 to an alternative direction with unit step.

The adjustment method of the steps can not limit the invention. For example, when the number N1 of times of the residue voltage $V_{RES}$ out of the bounds in the $i^{th}$ period is more than the number N1 of times of the residue voltage $V_{RES}$ out of the bounds in the $(i-1)^{th}$ period, the sign signal S4 changes the polarity of itself and the step signal S5 may set to one step according to the first comparison signal S31 of the comparison signal S3, and then the adjusting circuit 443 adjusts the clock of the sub ADCs 300 to the opposite direction but with unit step. When the number N1 of times of the residue voltage $V_{RES}$ out of the bounds in the $i^{th}$ period is less than the number N1 of times of the residue voltage $V_{RES}$ out of the bounds in the $(i-1)^{th}$ period, the sign signal S4 keeps the polarity of itself and the step signal S5 is set to two steps according to the second comparison signal S32 of the comparison signal S3, and then the adjusting circuit 443 adjusts the clock of the sub ADCs 300 to the original direction but with twice of unit step. When the number N1 of times of the residue voltage $V_{RES}$ out of the bounds in the $i^{th}$ period is equal to the number N1 of times of the residue voltage $V_{RES}$ out of the bounds in the $(i-1)^{th}$ period, the sign signal S4 may keep the polarity of itself and the step signal S5 may be set to zero step according to the third comparison signal S33 of the comparison signal S3, and then the adjusting circuit 443 may keep the clock of the sub ADCs 300. Furthermore, the calibration device 400 mentioned above adjusts the clock of the sub ADCs 300 in a background calibration.

Thus, the calibration device 400 is used to adjust the clock of the sub ADC 300 for reducing the sampling mismatch error due to the sampling clock skew and the signal paths bandwidth mismatch. And by the calibration device 400, the pipelined ADC 200 works without additional a plurality of SHA circuits at the front end of the sub ADCs 300 for saving the power consumption and the die area. Besides, the calibration device 400 works in the background calibration.

Figure 5:
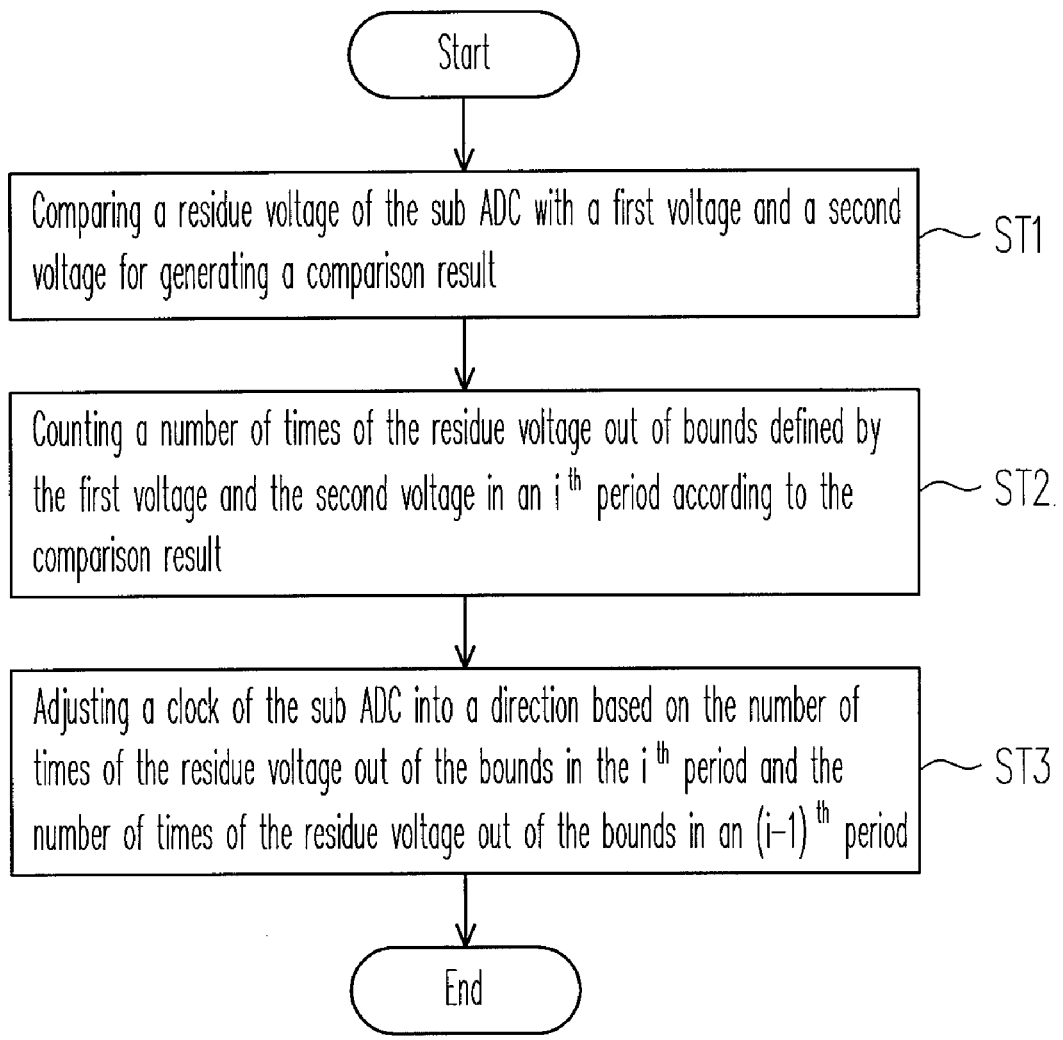
FIG. 5 shows a flowchart of a calibration method according to an embodiment of the invention.

FIG. 5 shows a flowchart of a calibration method according to an embodiment of the invention. The calibration method adapts to a sub ADC of a pipelined ADC, and the calibration method includes steps ST1 through ST3. The step ST1 indicates a residue voltage of the sub ADC is compared with a first voltage and a second voltage for generating a comparison result. The residue voltage of the sub ADC is explained in and the same as the last embodiment.

The step ST2 indicates a number of times of the residue voltage out of the bounds defined by the first voltage and the second voltage in an $i^{th}$ period is counted according to the comparison result, i.e. if the comparison result indicates the residue voltage of the sub ADC is out of the bounds defined by the first voltage and the second voltage, the number of times of the residue voltage out the bounds is increased by one as the last embodiment. Thus, the comparison result includes a first signal and a second signal. The first signal increases the number of times of the residue voltage out of the bounds by one when the residue voltage of the sub ADC is higher than the first voltage. The second signal increases the number of times of the residue voltage out of the bounds by one when the residue voltage of the sub ADC is lower than the second voltage.

The step ST3 indicates a clock of the sub ADC is adjusted into a direction based on the number of times of the residue voltage out of the bounds in the $i^{th}$ period and the number of times of the residue voltage out of the bounds in an $(i-1)^{th}$ period as the last embodiment. Accordingly, when the number of times of the residue voltage out of the bounds in the $i^{th}$ period is more than the number of times of the residue voltage out of the bounds in the $(i-1)^{th}$ period, the clock of the sub ADC is shifted into an opposite direction with twice of unit step. When the number of times of the residue voltage out of the bounds in the $i^{th}$ period is less than the number of times of the residue voltage out of the bounds in the $(i-1)^{th}$ period, the clock of the sub ADC is shifted into an original direction with unit step. When the number of times of the residue voltage out of the bounds in the $i^{th}$ period is equal to the number of times of the residue voltage out of the bounds in the $(i-1)^{th}$ period, the clock of the sub ADC is shifted into an alternative direction with unit step.

The adjustment method of the steps can not limit the invention. For example, when the number of times of the residue voltage out of the bounds in the $i^{th}$ period is more than the number of times of the residue voltage out of the bounds in the $(i-1)^{th}$ period, the clock of the sub ADC may be shifted into the opposite direction but with unit step. When the number of times of the residue voltage out of the bounds in the $i^{th}$ period is less than the number of times of the residue voltage out of the bounds in the $(i-1)^{th}$ period, the clock of the sub ADC may be shifted into the original direction but with twice of unit step. When the number of times of the residue voltage out of the bounds in the $i^{th}$ period is equal to the number of times of the residue voltage out of the bounds in the $(i-1)^{th}$ period, the clock of the sub ADC may be kept.

As a number of times of the residue voltage compared in the $i^{th}$ period is equals to a period number, the number of times of the residue voltage compared and the number of times of the residue voltage out of the bounds are zeroed. The period number is a maximum number can be counted in the $i^{th}$ period. Further, the $i^{th}$ period of the calibration method is related to a clock of a SHA circuit of the sub ADC.

Figure 6:
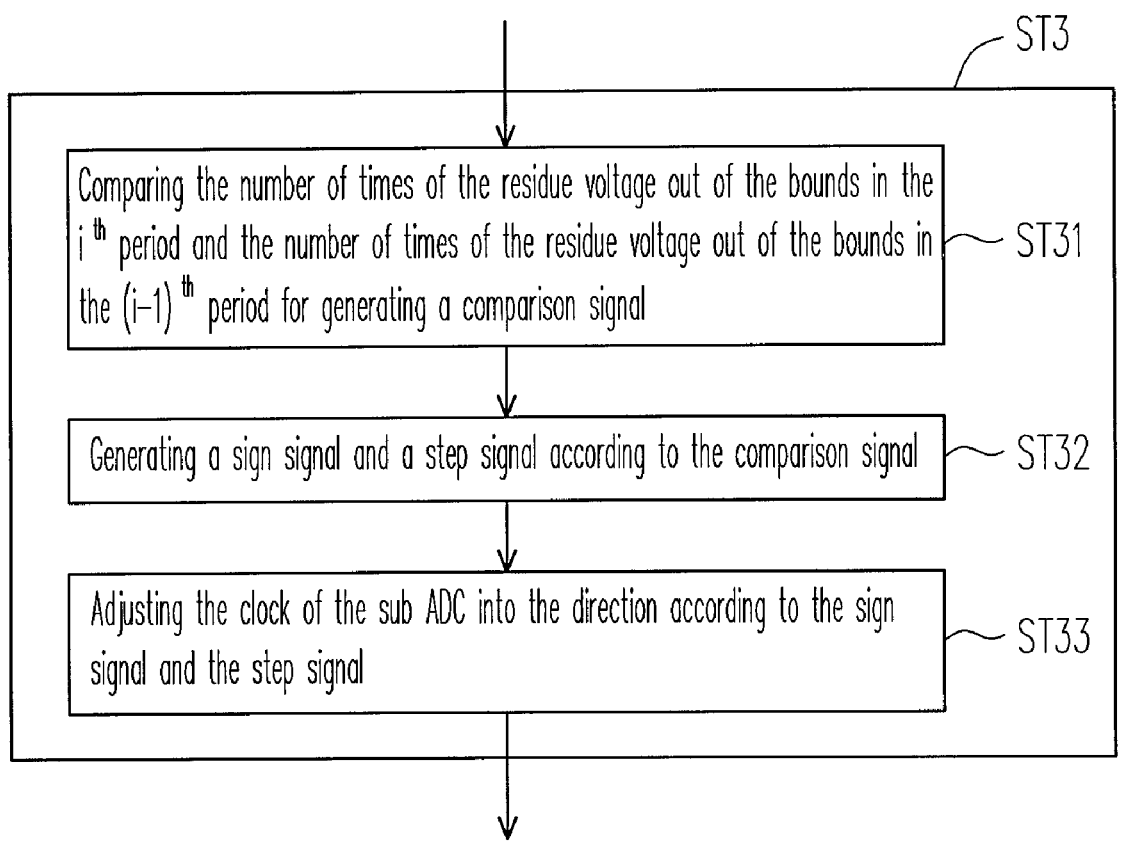
FIG. 6 shows a sub flowchart of the step ST3 of the flowchart in FIG. 5 according to an embodiment of the invention.

FIG. 6 shows a sub flowchart of the step ST3 according to an embodiment of the invention. The step ST3 includes steps ST31 through ST33. The step ST31 indicates the number of times of the residue voltage out of the bounds in the $i^{th}$ period is compared with the number of times of the residue voltage out of the bounds in the $(i-1)^{th}$ period for generating a comparison signal. The comparison signal represents a comparison outcome. The step ST32 indicates a sign signal and a step signal is generated according to the comparison signal. The sign signal represents a shifting direction of the clock of the sub ADC, and the step signal represents how many steps is the clock of the sub ADC shifted with along the shifting direction deciding by the sign signal as the last embodiment. The step ST33 indicates the clock of the sub ADC is adjusted into the shifting direction according to the sign signal and the step signal.

The comparison signal further includes a first comparison signal, a second comparison signal, and a third comparison signal. The first comparison signal represents the number of times of the residue voltage out of the bounds in the $i^{th}$ period is more than the number of times of the residue voltage out of the bounds in the $(i-1)^{th}$ period. The second comparison signal represents the number of times of the residue voltage out of the bounds in the $i^{th}$ period is less than the number of times of the residue voltage out of the bounds in the $(i-1)^{th}$ period. The third comparison signal represents the number of times of the residue voltage out of the bounds in the $i^{th}$ period is equal to the number of times of the residue voltage out of the bounds in the $(i-1)^{th}$ period.

Therefore, when the number of times of the residue voltage out of the bounds in the $i^{th}$ period is more than the number of times of the residue voltage out of the bounds in the $(i-1)^{th}$ period, the sign signal changes a polarity of itself and the step signal is set to two steps according to the first comparison signal of the comparison signal, and then the clock of the sub ADC is adjusted into an opposite direction with twice of unit step. When the number of times of the residue voltage out of the bounds in the $i^{th}$ period is less than the number of times of the residue voltage out of the bounds in the $(i-1)^{th}$ period, the sign signal keeps the polarity of itself and the step signal is set to one step according to the second comparison signal of the comparison signal, and then the clock of the sub ADC is adjusted to an original direction with unit step. When the number of times of the residue voltage out of the bounds in the $i^{th}$ period is equal to the number of times of the residue voltage out of the bounds in the $(i-1)^{th}$ period, the sign signal alternates the polarity of itself and the step signal is set to one step according to the third comparison signal of the comparison signal, and then the clock of the sub ADC is adjusted into an alternative direction with unit step.

The adjustment method of the steps can not limit the invention. For example, when the number of times of the residue voltage out of the bounds in the $i^{th}$ period is more than the number of times of the residue voltage out of the bounds in the $(i-1)^{th}$ period, the sign signal changes the polarity of itself and the step signal may set to one step according to the first comparison signal of the comparison signal, and then the clock of the sub ADC is adjusted into the opposite direction but with unit step. When the number of times of the residue voltage out of the bounds in the $i^{th}$ period is less than the number of times of the residue voltage out of the bounds in the $(i-1)^{th}$ period, the sign signal keeps the polarity of itself and the step signal is set to two steps according to the second comparison signal of the comparison signal, and then the clock of the sub ADC is adjusted to the original direction but with twice of unit step. When the number of times of the residue voltage out of the bounds in the $i^{th}$ period is equal to the number of times of the residue voltage out of the bounds in the $(i-1)^{th}$ period, the sign signal may keep the polarity of itself and the step signal may be set to zero step according to the third comparison signal of the comparison signal, and then the clock of the sub ADC may be kept. Furthermore, the calibration method mentioned above adjusts the clock of the sub ADC in a background calibration.

Thus, the calibration method is used to adjust the clock of the sub ADC for reducing the sampling mismatch error due to the sampling clock skew and the signal paths bandwidth mismatch. And by the calibration method, the pipelined ADC works without additional a plurality of SHA circuits at the front end of the sub ADCs for saving the power consumption and the die area. Besides, the calibration method works in the background calibration.

In summary, the calibration device and the calibration method adjust the clock of the sub ADC without additional a plurality of SHA circuits at a front end of each of the sub ADCs for saving the power consumption and the die area. Further, the calibration device and the calibration method work in the background calibration for the sub ADC.

Though the present invention has been disclosed above by the preferred embodiments, they are not intended to limit the present invention. Anybody skilled in the art can make some modifications and variations without departing from the spirit and scope of the present invention. Therefore, the protecting range of the present invention falls in the appended claims.

What is claimed is:

1. A calibration device, adapting to a sub analog-to-digital converter (ADC) of a pipelined ADC, comprising:
    a comparison unit for comparing a residue voltage of the sub ADC with a first voltage and a second voltage for generating a comparison result;
    a counting unit for counting a number of times of the residue voltage out of bounds defined by the first voltage and the second voltage in an $i^{th}$ period according to the comparison result;
    a memory for storing the number of times of the residue voltage out of the bounds in an $(i-1)^{th}$ period; and
    a compensation circuit for adjusting a clock of the sub ADC into a direction based on the number of times of the residue voltage out of the bounds in the $i^{th}$ period and the number of times of the residue voltage out of the bounds in the $(i-1)^{th}$ period.

2. The calibration device as claimed in claim 1, wherein the comparison result includes a first signal and a second signal, and the comparison unit comprises:
    a first comparator for comparing the residue voltage of the sub ADC with the first voltage for generating the first signal; and
    a second comparator for comparing the residue voltage of the sub ADC with the second voltage for generating the second signal.

3. The calibration device as claimed in claim 1, wherein the counting unit comprises:
    a first counter for counting a number of times compared by the comparison unit in the $i^{th}$ period; and
    a second counter for counting the number of times of the residue voltage out of the bounds in the $i^{th}$ period.

4. The calibration device as claimed in claim 3, when the residue voltage of the sub ADC is higher than the first voltage, the second counter increases the number of times of the residue voltage out of the bounds according to the comparison result; and
    when the residue voltage of the sub ADC is lower than the second voltage, the second counter increases the number of times of the residue voltage out of the bounds according to the comparison result.

5. The calibration device as claimed in claim 4, wherein the first voltage and the second voltage have the same amplitudes but different polarities.

6. The calibration device as claimed in claim 1, wherein the sub ADC comprises a sample and hold circuit, and the $i^{th}$ period is related to a clock of the sample and hold circuit of the sub ADC.

7. The calibration device as claimed in claim 3, when the number of times compared by the comparison unit equals to a period number, wherein the period number is related to a length of the $i^{th}$ period, the memory stores the number of times of the residue voltage out of the bounds, and then the counting unit zeros the number of times compared by the comparison unit and the number of times of residue voltage out of the bounds.

8. The calibration device as claimed in claim 1, wherein the compensation circuit comprising:
    a third comparator for comparing the number of times of the residue voltage out of the bounds in the $i^{th}$ period from the comparison unit and the number of times of the residue out of the bounds in the $(i-1)^{th}$ period from the memory for generating a comparison signal;
    a control circuit for generating a sign signal and a step signal according to the comparison signal; and
    an adjusting circuit for adjusting the clock of the sub ADC according to the sign signal and the step signal.

9. The calibration device as claimed in claim 8, wherein the comparison signal comprises:
    a first comparison signal for representing the number of times of the residue voltage out of the bounds in the $i^{th}$ period is more than the number of times of the residue voltage out of the bounds in the $(i-1)^{th}$ period;
    a second comparison signal for representing the number of times of the residue voltage out of the bounds in the $i^{th}$ period is less than the number of times of the residue voltage out of the bounds in the $(i-1)^{th}$ period; and
    a third comparison signal for representing the number of times of the residue voltage out of the bounds in the $i^{th}$ period is equal to the number of times of the residue voltage out of the bounds in the $(i-1)^{th}$ period.

10. The calibration device as claimed in claim 9, when the number of times of the residue voltage out of the bounds in the $i^{th}$ period is more than the number of times of the residue voltage out of the bounds in the $(i-1)^{th}$ period, the sign signal changes a polarity of itself and the step signal is set to two steps according to the first comparison signal of the comparison signal, and then the adjusting circuit adjusts the clock of the sub ADC to an opposite direction with twice of unit step;
    when the number of times of the residue voltage out of the bounds in the $i^{th}$ period is less than the number of times of the residue voltage out of the bounds in the $(i-1)^{th}$ period, the sign signal keeps the polarity of itself and the step signal is set to one step according to the second comparison signal of the comparison signal, and then the adjusting circuit adjusts the clock of the sub ADC to an original direction with unit step; and
    when the number of times of the residue voltage out of the bounds in the $i^{th}$ period is equal to the number of times of the residue voltage out of the bounds in the $(i-1)^{th}$ period, the sign signal alternates the polarity of itself and the step signal is set to one step according to the third comparison signal of the comparison signal, and then the adjusting circuit adjusts the clock of the sub ADC to an alternative direction with unit step.

11. The calibration device as claimed in claim 9, when the number of times of the residue voltage out of the bounds in the $i^{th}$ period is more than the number of times of the residue voltage out of the bounds in the $(i-1)^{th}$ period, the sign signal changes a polarity of itself and the step signal is set to one step according to the first comparison signal of the comparison signal, and then the adjusting circuit adjusts the clock of the sub ADC to an opposite direction with unit step;
    when the number of times of the residue voltage out of the bounds in the $i^{th}$ period is less than the number of times of the residue voltage out of the bounds in the $(i-1)^{th}$ period, the sign signal keeps the polarity of itself and the step signal is set to two steps according to the second comparison signal of the comparison signal, and then the adjusting circuit adjusts the clock of the sub ADC to an original direction with twice of unit step; and when the number of times of the residue voltage out of the bounds in the $i^{th}$ period is equal to the number of times of the residue voltage out of the bounds in the $(i-1)^{th}$ period, the sign signal keeps a polarity of itself and the step signal is set to zero step according to the third comparison signal of the comparison signal, and then the adjusting circuit keeps the clock of the sub ADC.

12. A calibration method, adapting to a sub analog-to-digital converter (ADC) of a pipelined ADC, comprising:

comparing a residue voltage of the sub ADC with a first voltage and a second voltage for generating a comparison result;

counting a number of times of the residue voltage out of bounds defined by the first voltage and the second voltage in an $i^{th}$ period according to the comparison result; and adjusting a clock of the sub ADC into a direction based on the number of times of the residue voltage out of the bounds in the period and the number of times of the residue voltage out of the bounds in an $(i-1)^{th}$ period.

13. The calibration method as claimed in claim 12, counting a number of times of the residue voltage compared in the $i^{th}$ period.

14. The calibration method as claimed in claim 12, wherein the comparison signal includes a first signal and a second signal;

when the residue voltage of the sub ADC is higher than the first voltage, a first signal increases the number of times of the residue voltage out of the bounds; and when the residue voltage of the sub ADC is lower than the second voltage, a second signal increases the number of times of the residue voltage out of the bounds.

15. The calibration method as claimed in claim 14, wherein the first voltage and the second voltage have the same amplitudes but different polarities.

16. The calibration method as claimed in claim 12, wherein the sub ADC comprises a sample and hold circuit, and the $i^{th}$ period is related to a clock of the sample and hold circuit of the sub ADC.

17. The calibration method as claimed in claim 13, when the number of times of the residue voltage compared equals to a period number, wherein the period number is related to a length of the $i^{th}$ period, the number of times of the residue voltage out of the bounds and the number of times of the residue voltage compared are zeroed.

18. The calibration method as claimed in claim 12, wherein adjusting the clock of the sub ADC into a direction based on the number of times of the residue voltage out of the bounds in the $i^{th}$ period and the number of times of the residue voltage out of the bounds in the $(i-1)^{th}$ period comprises:

comparing the number of times of the residue voltage out of the bounds in the $i^{th}$ period and the number of times of the residue voltage out of the bounds in the $(i-1)^{th}$ period for generating a comparison signal;

generating a sign signal and a step signal according to the comparison signal; and adjusting the clock of the sub ADC into the direction according to the sign signal and the step signal.

19. The calibration method as claimed in claim 18, wherein the comparison signal comprises:

a first comparison signal for representing the number of times of the residue voltage out of the bounds in the $i^{th}$ period is more than the number of times of the residue voltage out of the bounds in the $(i-1)^{th}$ period;

a second comparison signal for representing the number of times of the residue voltage out of the bounds in the $i^{th}$ period is less than the number of times of the residue voltage out of the bounds in the $(i-1)^{th}$ period; and a third comparison signal for representing the number of times of the residue voltage out of the bounds in the $i^{th}$ period is equal to the number of times of the residue voltage out of the bounds in the $(i-1)^{th}$ period.

20. The calibration method as claimed in claim 19, when the number of times of the residue voltage out of the bounds in the $i^{th}$ period is more than the number of times of the residue voltage out of the bounds in the $(i-1)^{th}$ period, the sign signal changes a polarity of itself and the step signal is set to two steps according to the first comparison signal of the comparison signal, and then the clock of the sub ADC is adjusted to an opposite direction with twice of unit step;

when the number of times of the residue voltage out of the bounds in the $i^{th}$ period is less than the number of times of the residue voltage out of the bounds in the $(i-1)^{th}$ period, the sign signal keeps the polarity of itself and the step signal is set to one step according to the second comparison signal of the comparison signal, and then the clock of the sub ADC is adjusted to an original direction with unit step;

when the number of times of the residue voltage out of the bounds in the $i^{th}$ period is equal to the number of times of the residue voltage out of the bounds in the $(i-1)^{th}$ period, the sign signal alternates the polarity of itself and the step signal is set to one step according to the third comparison signal of the comparison signal, and then the clock of the sub ADC is adjusted to an alternative direction with unit step.

21. The calibration method as claimed in claim 19, when the number of times of the residue voltage out of the bounds in the $i^{th}$ period is more than the number of times of the residue voltage out of the bounds in the $(i-1)^{th}$ period, the sign signal changes a polarity of itself and the step signal is set to one step according to the first comparison signal of the comparison signal, and then the clock of the sub ADC is adjusted to an opposite direction with unit step;

when the number of times of the residue voltage out of the bounds in the $i^{th}$ period is less than the number of times of the residue voltage out of the bounds in the $(i-1)^{th}$ period, the sign signal keeps the polarity of itself and the step signal is set to two steps according to the second comparison signal, and then the clock of the sub ADC is adjusted to an original direction with twice of unit step;

when the number of times of the residue voltage out of the bounds in the $i^{th}$ period is equal to the number of times of the residue voltage out of the bounds in the $(i-1)^{th}$ period, the sign signal alternates the polarity of itself and the step signal is set to zero step according to the third comparison signal, and then the clock of the sub ADC is kept.

* * * * *